(12) United States Patent
Ueda

(10) Patent No.: US 10,679,558 B2
(45) Date of Patent: Jun. 9, 2020

(54) DISPLAY DEVICE

(71) Applicant: Sharp Kabushiki Kaisha, Sakai, Osaka (JP)

(72) Inventor: Naoki Ueda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/477,555

(22) PCT Filed: Sep. 25, 2017

(86) PCT No.: PCT/JP2017/034435
§ 371 (c)(1),
(2) Date: Jul. 12, 2019

(87) PCT Pub. No.: WO2019/058538
PCT Pub. Date: Mar. 28, 2019

(65) Prior Publication Data
US 2019/0362673 A1    Nov. 28, 2019

(51) Int. Cl.
*G09G 3/3233*    (2016.01)
*G09G 3/3266*    (2016.01)
(Continued)

(52) U.S. Cl.
CPC ......... *G09G 3/3233* (2013.01); *G09G 3/3266* (2013.01); *G09G 3/3275* (2013.01); *H01L 27/3265* (2013.01); *H01L 27/3276* (2013.01)

(58) Field of Classification Search
None
See application file for complete search history.

(56) References Cited

U.S. PATENT DOCUMENTS 5,650,636 A      7/1997   Takemura et al.
2007/0118781 A1  5/2007   Kim
(Continued)

FOREIGN PATENT DOCUMENTS

JP    07-333653 A     12/1995
JP    2004-341351 A   12/2004
(Continued)

OTHER PUBLICATIONS

Official Communication issued in International Patent Application No. PCT/JP2017/034435, dated Nov. 28, 2017.

*Primary Examiner* — Stephen T. Reed
(74) *Attorney, Agent, or Firm* — Keating & Bennett, LLP

(57) ABSTRACT

The present application discloses to provide a display device capable of displaying an image with a luminance depending on a data signal by controlling pulling of a gate voltage of a driving transistor occurring when a writing period starts and ends and a driving method of the display device.

A pixel circuit including a compensation circuit compensating variation of a threshold value of a driving transistor is provided with a boost capacitor including a MOS capacitor between a node connected to a gate terminal of the driving transistor and a scanning line. A current value of a drive current is controlled by the driving transistor by using the pulling of the potential of the node being different between a case that a low level voltage is applied the scanning line connected to the boost capacitor and a case that a high level voltage is applied.

10 Claims, 16 Drawing Sheets

(51) Int. Cl.
*G09G 3/3275* (2016.01)
*H01L 27/32* (2006.01)

(56) References Cited

U.S. PATENT DOCUMENTS

| | | | |
|---|---|---|---|
| 2008/0219401 A1* | 9/2008 | Tobita | G09G 3/3677 |
| | | | 377/79 |
| 2009/0201231 A1 | 8/2009 | Takahara et al. | |
| 2011/0109537 A1* | 5/2011 | Uguen | G09G 3/3406 |
| | | | 345/102 |
| 2012/0127220 A1* | 5/2012 | Noguchi | G09G 3/3233 |
| | | | 345/690 |
| 2019/0268554 A1* | 8/2019 | Kawai | H04N 5/363 |

FOREIGN PATENT DOCUMENTS

| | | |
|---|---|---|
| JP | 2007-079580 A | 3/2007 |
| JP | 2009-276744 A | 11/2009 |
| JP | 2013-048425 A | 3/2013 |
| WO | 2011/013409 A1 | 2/2011 |

* cited by examiner

DISPLAY DEVICE

TECHNICAL FIELD

The disclosure relates to a display device and a driving method of the display device, and more specifically, relates to a display device such as an organic EL (Electro Luminescence) display device provided with a display element driven by currents and a driving method of the display device.

BACKGROUND ART

An organic EL display device has been known as a thin-type, high picture quality, and low power consumption display device. In the organic EL display device, a plurality of pixel circuits including organic EL elements (also referred to as "Organic Light Emitting Diodes") that are self-luminous type display elements driven by currents and driving transistors, are arranged in a matrix.

FIG. 13 is diagram illustrating a configuration of a pixel circuit 111 in the related art. As illustrated in FIG. 13, the pixel circuit 111 includes one organic EL element OLED, seven transistors M1 to M7, and a storage capacitor Cst. The transistors M1 to M7 all are P-channel type transistors.

The transistor M1 is a driving transistor for controlling a current to be supplied to the organic EL element OLED. The transistor M2 is a writing transistor for writing a voltage depending on a data signal (data voltage) into the pixel circuit 111. The transistor M3 is a compensation transistor for compensating variation in a threshold voltage of the driving transistor M1 which causes a luminance unevenness. The transistor M4 is a first initialization transistor for initializing a potential of a node N at which a gate terminal of the driving transistor M1 is connected to one terminal of the storage capacitor Cst described later, that is, a gate voltage Vg of the driving transistor M1. The transistor M5 is a power supply transistor for supplying a high level voltage ELVDD to the pixel circuit 111. The transistor M6 is a light emission control transistor for controlling a light emission period of the organic EL element OLED. The transistor M7 is a second initialization transistor for initializing an anode voltage of the organic EL element OLED.

The storage capacitor Cst is a capacitor including one terminal connected to the gate terminal of the driving transistor M1 via the node N and the other terminal connected to the high level power source line ELVDD, and holds, for one frame period, an electric charge equivalent to a voltage difference between the high level voltage ELVDD and a data voltage applied to the gate terminal of the driving transistor M1. In the pixel circuit 111, a data line capacitor Cdi that is a parasitic capacitance of a data line Di having been separated and the storage capacitor Cst are linked in a writing period. This allows an electric charge equivalent to the data voltage held in the data line capacitor Cdi to be distributed again into the data line capacitor Cdi and the storage capacitor Cst.

In the pixel circuit 111, before writing the data voltage into the node N, the first initialization transistor M4 provided between an initialization power source line Vini and the storage capacitor Cst is made to turn to an on state to decrease the potential of the node N to an initialization potential Vini. This allows the potential of the node N to be initialized so that the data voltage is written into the node N via the writing transistor M2, the driving transistor M1, and the compensation transistor M3 in the writing period in which a potential of a scanning line Sj is in a low level.

A low transconductance transistor is used for the above driving transistor M1 in order to facilitate control of a drive current for the display element OLED. In this case, even when it is attempted to write a data voltage of a potential the farthest from the initialization potential into the potential of the node N via the driving transistor M1 in the writing period, the writing cannot be made within the writing period, leading to charge shortage.

For example, the pixel circuit 111 including the P-channel type transistors writes a voltage on a lower level side as an initialization voltage and then allocates the voltage on the lower level side to a higher luminance side and a voltage on a higher level side to a lower luminance side. FIG. 14 is a timing chart illustrating pixel circuit actions of the pixel circuit 111 illustrated in FIG. 13. As illustrated in FIG. 14, when the scanning line Sj is changed from a high level to a low level at a time point t3, the potential of the node N cannot be charged to the data voltage for a short time, and thus the gate voltage Vg applied to the gate terminal of the driving transistor M1 cannot change from the initialization voltage to the voltage on the lower level side displaying a high luminance image for a short time. For this reason, the driving transistor M1 cannot supply a drive current displaying the high luminance image to the display element OLED.

FIG. 15 is a diagram illustrating a configuration of a pixel circuit 112 in the related art described in PLT 1. The pixel circuit 112 illustrated in FIG. 15 is further provided with a boost capacitor Cbs including a parallel-plate capacitor, in the pixel circuit 111 illustrated in FIG. 13. The boost capacitor Cbs includes one terminal connected to the scanning line Sj and the other terminal connected to the node N. The configuration is the same as the configuration illustrated in FIG. 13, and therefore, a description thereof is omitted. FIG. 16 is a timing chart illustrating actions of the pixel circuit 112 illustrated in FIG. 15. As illustrated in FIG. 16, in a case where the voltage applied to the scanning line Sj changes from the high level to the low level, the potential of the node N, that is, the gate voltage Vg of the driving transistor M1 is pushed down by the boost capacitor Cbs and decreased by a low level voltage applied to the scanning line Sj. In this way, the boost capacitor Cbs being provided allows the potential of the node N to be instantaneously pushed down, and therefore, when the scanning line Sj changes from the high level to the low level at the time point t3, the gate voltage Vg is instantaneously pushed down to a direction in which the drive current for the driving transistor M1 increases. This allows a source-gate voltage Vgs of the driving transistor M1 to increase so that the node N is charged with a data voltage Vdata supplied from the data line Di to improve a drive capability of the driving transistor M1. In association with this, the gate voltage Vg of the driving transistor M1 can transit from the initialization voltage to a voltage of the data voltage Vdata overlapped with a threshold voltage for a short time so that a threshold voltage Vth is compensated.

PTL 2 discloses a pixel circuit including a MOS capacitor provided between a gate of a driving transistor and a scanning line.

CITATION LIST

Patent Literature

PTL 1: JP 2007-79580 A
PTL 2: JP 2004-341351 A

SUMMARY

Technical Problem

However, in the organic EL display device illustrated in FIG. 15, as illustrated in FIG. 16, at time point t4 when the potential of the scanning line Sj changes from the low level to the high level, the gate voltage Vg of the driving transistor M1 is pushed up to a direction opposite to the case of the time point t3. In this case, with the gate voltage Vg, in the pixel circuit 111 including the P-channel type transistors, an image further shifted to the lower luminance side than the luminance depending on the data voltage is displayed.

The MOS capacitor in PTL 2 has an object to bias, when the writing transistor is in an off state, the gate of the driving transistor to the opposite direction by the charged MOS capacitor to thereby suppress the potential of the node being pulled by the MOS capacitor. Therefore, PTL 2 does not disclose that characteristics of the MOS capacitor are used to strengthen or suppress the pulling of the potential of the node.

Accordingly, the disclosure has an object to provide a display device capable of displaying an image with a luminance depending on the data signal by controlling the pulling of the gate voltage of the driving transistor occurring when the writing period starts and ends, and a driving method of the display device.

Solution to Problem

A display device according to an aspect of an embodiment of the disclosure is a display device including a plurality of data lines configured to transmit a plurality of data signals indicating an image to be displayed, a plurality of scanning lines intersecting the plurality of data lines, and a plurality of pixel circuits arranged in a matrix along the plurality of data lines and the plurality of scanning lines, the display device including:

a data line drive circuit configured to output the plurality of data signals to the plurality of data lines; and a scanning line drive circuit configured to supply a scanning signal to any one of the plurality of scanning lines to selectively drive the scanning line, wherein each of the plurality of pixel circuits corresponds to any one of the plurality of data lines and corresponds to any one of the plurality of scanning lines, each of the plurality of pixel circuits includes a display element driven by a current, a first capacitance configured to hold a voltage controlling the drive current for the display element, a driving transistor configured to supply a drive current depending on the voltage held in the first capacitance to the display element, a second capacitance connecting the scanning line to a control terminal of the driving transistor, and the second capacitance includes a MOS capacitance and configured to control a voltage applied to the control terminal of the driving transistor by use of a capacitance changing depending on a level of the scanning signal supplied to the scanning line.

A driving method of a display device according to another aspect of an embodiment of the disclosure is a driving method of a display device, the display device including a plurality of data lines configured to transmit a plurality of data signals indicating an image to be displayed, a plurality of scanning lines intersecting the plurality of data lines, and a plurality of pixel circuits arranged in a matrix along the plurality of data lines and the plurality of scanning lines, the display device including
a data line drive circuit outputting the plurality of data signals to the plurality of data lines, respectively, and
a scanning line drive circuit supplying a scanning signal to any one of the plurality of scanning lines to selectively drive the scanning line, wherein each of the plurality of pixel circuits corresponds to any one of the plurality of data lines and corresponds to any one of the plurality of scanning lines, each pixel circuit includes a display element driven by a current, a first capacitance configured to hold a voltage controlling the drive current for the display element, a driving transistor configured to supply a drive current depending on the voltage held in the first capacitance to the display element, a second capacitance connecting the scanning line to a control terminal of the driving transistor, and the second capacitance is a MOS capacitance including an electrode, an insulating layer, and a semiconductor layer, the electrode being connected to the scanning line, the semiconductor layer being connected to the control terminal of the driving transistor, the driving method including
controlling to pull a voltage to be applied to the control terminal of the driving transistor by applying a voltage to the scanning line in such a way that a voltage is applied to a gate terminal of the second capacitance to form an accumulation layer in an interface of the semiconductor layer in contact with the insulating layer, when a writing period starts during which the first capacitance is charged with a voltage controlling the drive current for the display element, and controlling to suppress pulling the voltage to be applied to the control terminal of the driving transistor by applying a voltage to the scanning line in such a way that a depletion layer is formed in an interface of the semiconductor layer in contact with the insulating layer, when the writing period ends.

Advantageous Effects of Disclosure

In the display device according to an aspect of an embodiment of the disclosure, each pixel circuit is provided with the second capacitance connecting the scanning line and the control terminal of the driving transistor in each pixel circuit. The second capacitance includes the MOS capacitance, and thus a capacitance value of the second capacitance is different between a case that the potential of the scanning line applied to the gate electrode of the second capacitance changes from the low level to the high level and a case of changing from the high level to the low level. Therefore, the capacitance value of the second capacitance is made to be larger when the writing period during which the data voltage is written into the first capacitance starts such that the pulling by the second capacitance is greater. As a result, the first capacitance can be charged to the data voltage for a short time. The capacitance value of the second capacitance is made to be smaller when the write period ends such that the pulling by the second capacitance is smaller. As a result, the data voltage held in a large capacitance change little, and therefore, an image with a luminance depending on the data voltage can be displayed.

In the driving method of a display device according to another aspect of an embodiment of the disclosure, an effect the same as the aspect described above can be provided.

DESCRIPTION OF EMBODIMENTS

Hereinafter, embodiments of the disclosure will be described below with reference to the accompanying drawings. Note that in each transistor referred to in a description below, a gate terminal corresponds to a control terminal, and one of a drain terminal and a source terminal corresponds to a first conducting terminal and the other corresponds to a second conducting terminal.

Each of transistors in each embodiment is described as a P-channel type transistor, but the disclosure is not limited thereto, and an N-channel type transistor may be adopted. Note that pushing down a voltage applied to a gate terminal of a driving transistor in a pixel circuit including the P-channel type transistors corresponds to pushing up a voltage applied to a gate terminal of a driving transistor in a pixel circuit including the N-channel type transistors. Similarly, pushing down a voltage applied to a gate terminal of a driving transistor in a pixel circuit including P-channel transistors corresponds to pushing up a voltage applied to a gate terminal of a driving transistor in a pixel circuit including N-channel transistors. Therefore, in consideration of correspondence to any pixel circuit, "pulling" may be used in place of "pushing down" and "pushing up". Furthermore, each of the transistors in each embodiment is a thin film transistor (TFT), for example, but the disclosure is not limited thereto.

The term "connection" used herein means an "electrical connection" otherwise specifically described, and includes not only a direct connection but also an indirect connection via another element within a scope not departing from the gist of the disclosure.

1. Embodiment

Hereinafter, a description is given of an organic EL display device 1 according to an embodiment of the disclosure with reference to the accompanying drawings.

1.1 Overall Configuration

Figure 1:
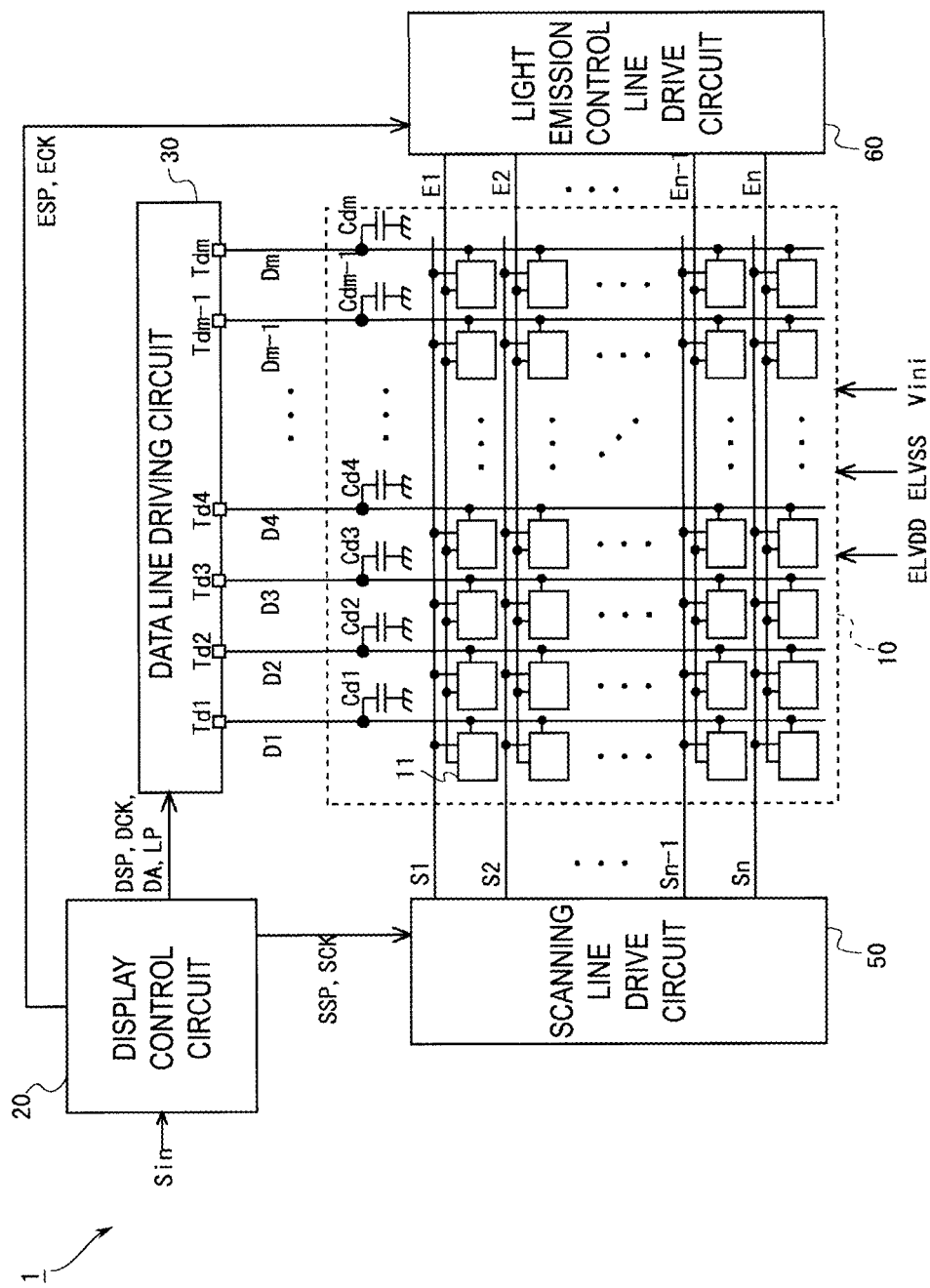
FIG. 1 is a block diagram illustrating an entire configuration of an organic EL display device according to an embodiment of the disclosure.

FIG. 1 is a block diagram illustrating an entire configuration of an organic EL display device according to embodiment of the disclosure. The organic EL display device 1 according to the present embodiment is generally a display device capable of color display of RGB three-primary colors, but a display device displaying any one color is adopted in the present embodiment for the purpose of simplification. For this reason, the organic EL display device 1 does not include a demultiplexer.

The organic EL display device 1 is an active matrix type display device including a display portion 10, a display control circuit 20, a data line drive circuit 30, a scanning line drive circuit 50, and a light emission control line drive circuit 60, as illustrated in FIG. 1. The organic EL display device 1 does not include a demultiplexer, and thus a data signal is supplied from the data line drive circuit 30 to each data line Di. Note that the scanning line drive circuit 50 and the light emission control line drive circuit 60 may be integrally formed with the display portion 10, for example, or formed separately from the display portion 10.

The display portion 10 is provided with m data lines D1 to Dm (m represents an integer equal to or more than 2) and n scanning lines S1 to Sn intersecting with those data lines. The display portion 10 is provided with m×n pixel circuits 11 corresponding to intersections of the data lines D1 to Dm and the scanning lines S1 to Sn. The display portion 10 includes light emission control lines E1 to En arranged therein as n control lines in parallel with n scanning lines S1 to Sn. The m data lines D1 to Dm are connected to the data line drive circuit 30, and the n scanning lines S1 to Sn are connected to the scanning line drive circuit 50. The n light emission control lines E1 to En are connected to the light emission control line drive circuit 60.

The display portion 10 includes power source lines common to the pixel circuits 11 also arranged therein. More specifically, a power source line that supplies a high level voltage ELVDD for driving an organic EL element OLED described later and a power source line that supplies a low level voltage ELVSS are arranged. Furthermore, an initialization power source line Vini supplying an initialization potential Vini for initialization actions described later, is arranged. In the present embodiment, the high level power source line ELVDD supplies the high level voltage ELVDD and the low level power source line ELVSS supplies the low level voltage ELVSS.

One ends of m data capacitors Cd1 to Cdm are respectively connected to m data lines D1 to Dm, and the other ends (on a side not connected to the data lines Di) are grounded to hold the voltages (data voltages) of the data signals applied to the data lines Di.

The display control circuit 20 outputs various control signals to the data line drive circuit 30, the scanning line drive circuit 50, and the light emission control line drive circuit 60. To be more specific, the display control circuit 20 outputs a data start pulse DSP, a data clock DCK, display data DA, and a latch pulse LP to the data line drive circuit 30. The display control circuit 20 outputs a gate start pulse SSP and a gate clock SCK to the scanning line drive circuit 50, and outputs an emission start pulse ESP and an emission clock ECK to the light emission control line drive circuit 60.

The data line drive circuit 30 includes an m-bit shift register, a sampling circuit, a latch circuit, m D/A converters, and the like which are not illustrated. The shift register includes m bistable circuits cascade-connected with each other, and synchronizes the data start pulse DSP supplied to the first stage with the data clock DCK and transfers the resultant to output the sampling pulses from respective stages. At an output timing of the sampling pulse, the display data DA is supplied to the sampling circuit. The sampling circuit stores the display data DA in accordance with the sampling pulse. When the display data DA of one row is stored in the sampling circuit, the display control circuit 20 outputs the latch pulse LP to the latch circuit. The latch circuit, on receiving the latch pulse LP, holds the display data DA stored in the sampling circuit. The D/A converters, which are provided correspondingly to m data lines D1 to Dm respectively connected to m output terminals (not illustrated) of the data line drive circuit 30, convert the display data DA held by the latch circuit into the data signals that are analog signals, and supplies the obtained data signals to the output lines D1 to Dm.

The scanning line drive circuit 50 drives n scanning lines S1 to Sn. To be more specific, the scanning line drive circuit 50 includes a shift register, a buffer, and the like (not illustrated) in the figure. The shift register sequentially transfers the gate start pulse SSP in synchronization with the gate clock SCK. The scanning signals which are outputs from respective stages of the shift register are sequentially supplied through the buffer to the corresponding scanning lines Sj (j=1 to n). m pixel circuits 11 connected to the scanning line Sj are collectively selected by the active scanning signal (at the "low level scanning signal" in the present embodiment).

The light emission control line drive circuit 60 drives n light emission control lines E1 to En. To be more specific, the slight emission control line drive circuit 60 includes a shift register, a buffer, and the like (not illustrated) in the figure. The shift register sequentially transfers the emission start pulse ESP in synchronization with the emission clock ECK. Emission signals which are outputs from respective stages of the shift register are supplied through the buffer to the corresponding light emission control lines Ej.

1.2. Configuration of Pixel Circuit

Figure 2:
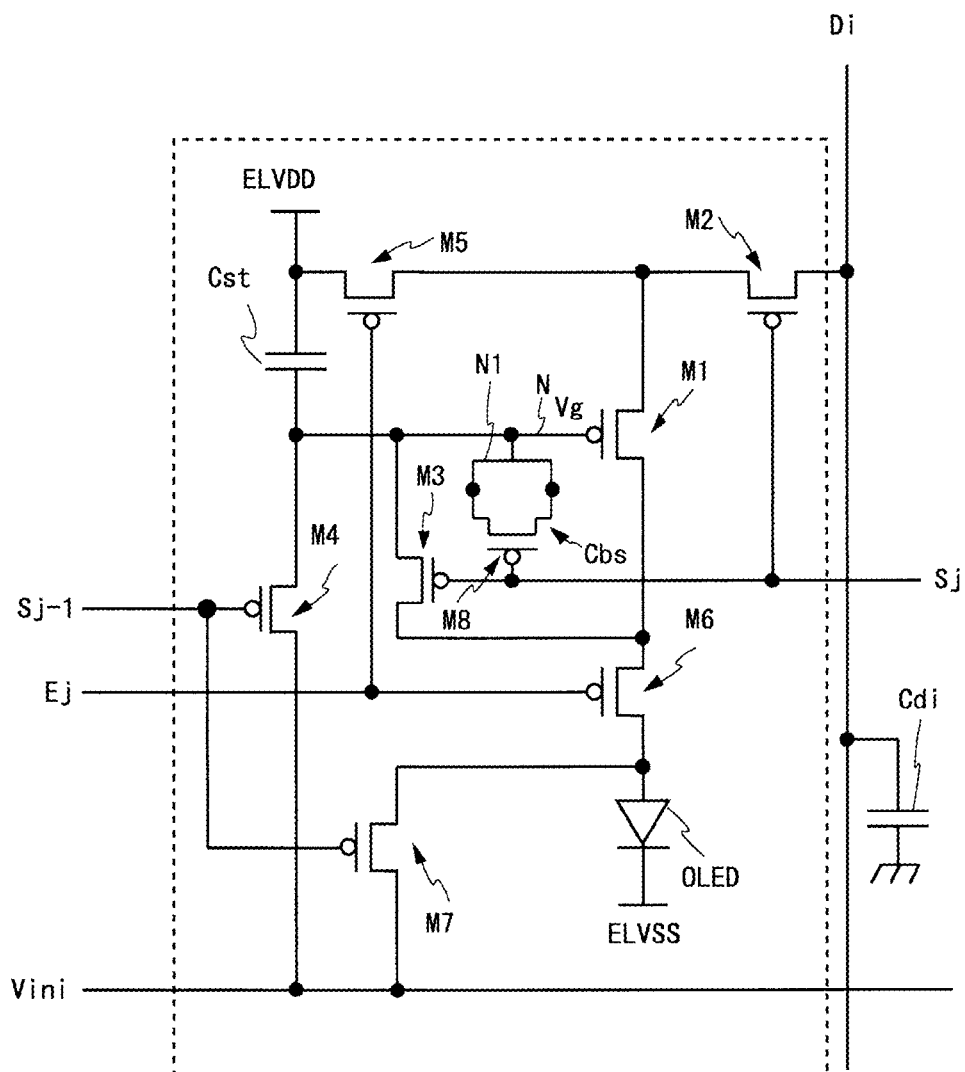
FIG. 2 is a circuit diagram illustrating a configuration of a pixel circuit including a compensation circuit compensating variation of a threshold value in the organic EL display device illustrated in FIG. 1.

FIG. 2 is a circuit diagram illustrating a configuration of the pixel circuit 11 including a compensation circuit compensating variation of a threshold value. Referring to FIG. 2, the pixel circuit 11 includes one organic EL element OLED (also referred to as a "display element"), seven transistors M1 to M7, and two capacitors Cst and Cbs. To be more specific, the pixel circuit 11 includes an organic EL element OLED, a driving transistor M1, a writing transistor M2, a compensation transistor M3, a first initialization transistor M4, a power supply transistor M5, a light emission control transistor M6, a second initialization transistor M7, a storage capacitor (also referred to as a "first capacitance") Cst, and a boost capacitor (also referred to as a "second capacitance") Cbs as a MOS capacitor (also referred to as a "MOS capacitance") by shorting a first conduction terminal and a second conduction terminal of a capacitor transistor M8. Note that in FIG. 2, an auxiliary wiring line N1 is provided as an example of an auxiliary wiring line for connecting a source region and a drain region of the capacitor transistor M8, and a detailed description of the auxiliary wiring line is described later.

The pixel circuit 11 is connected with a scanning line Sj, a scanning line Sj−1 immediately preceding the scanning line Sj (also referred to as an "immediately preceding scanning line"), a light emission control line Ej, a data line Di, a high level power source line ELVDD, a low level power source line ELVSS, and an initialization power source line Vini. Note that the high level power source line ELVDD is a power source line supplying a high level voltage ELVDD, the low level power source line ELVSS is a power source line supplying a low level voltage ELVSS, and the initialization power source line Vini is a power source line supplying an initialization potential Vini.

In the pixel circuit 11, the writing transistor M2 includes a gate terminal connected to the scanning line Sj, a source terminal as the first conduction terminal connected to the data line Di, and a drain terminal as the second conduction terminal connected to a source terminal of the driving transistor M1 and a drain terminal of the power supply transistor M5. The writing transistor M2 supplies a data voltage charged on the data line Di to the driving transistor M1 depending on selection of the scanning line Sj.

The source terminal as a first conduction terminal of the driving transistor M1 is connected to the drain terminal as the second conduction terminal of the writing transistor M2. The driving transistor M1 supplies a drive current depending on a gate voltage (to be more specific, a "gate-source terminal voltage Vgs") to the organic EL element OLED via the light emission control transistor M6 described later.

The compensation transistor M3 is provided between a gate terminal and a drain terminal as a second conduction terminal of the driving transistor M1, and includes a source terminal connected to the drain terminal of the driving transistor M1. In the pixel circuit 11, a gate terminal of the compensation transistor M3 is connected to the scanning line Sj. The compensation transistor M3 turns to an on state when the scanning line Sj becomes active ("a potential of the scanning line Sj becomes a low level") so that the gate terminal and the drain terminal of the driving transistor M1 are connected to each other to diode-connect the driving transistor M1.

The first initialization transistor M4 includes a gate terminal connected to the immediately preceding scanning line Sj−1, and is provided between the gate terminal of the driving transistor M1 and the initialization power source line Vini. When the first initialization transistor M4 turns to the on state depending on selection of the immediately preceding scanning line Sj−1, a potential of a node N (also referred to as a "first wiring line") connecting a drain terminal of the first initialization transistor M4 to the gate terminal of the driving transistor M1 becomes the initialization potential Vini. This allows the initialization potential Vini to be supplied to the gate terminal of the driving transistor M1.

The power supply transistor M5 includes a gate terminal connected to the light emission control line Ej, and is provided between the high level power source line ELVDD and the source terminal of the driving transistor M1. When the power supply transistor M5 turns to the on state depending on selection of the light emission control line Ej, the high level voltage ELVDD is supplied to the source terminal of the driving transistor M1.

The light emission control transistor M6 includes a gate terminal connected to the light emission control line Ej, and is provided between the driving transistor M1 and the organic EL element OLED. When the light emission control transistor M6 turns to the on state depending on the selection of the light emission control line Ej, the light emission control transistor M6 supplies a drive current to the organic EL element OLED.

The storage capacitor Cst includes one terminal connected via the node N to the gate terminal of the driving transistor M1 and the other terminal connected to the high level power source line ELVDD. The storage capacitor Cst is charged with the voltage (data voltage) of the data line Di when the scanning line Sj is in a select state and holds the data voltage written through the charge when the scanning line Sj is in a non-select state (a potential of the scanning line Sj is a high level) to maintain the gate voltage Vg of the driving transistor M1.

The boost capacitor Cbs includes the MOS capacitor, and includes one terminal (a terminal connected to a gate electrode of the MOS capacitor) connected to the scanning line Sj and the other terminal (a terminal connected to a semiconductor layer of the MOS capacitor) connected to the node N. When a potential of the immediately preceding scanning line Sj−1 changes from the high level to the low level, the first initialization transistor M4 turns to the on state so that the node N is connected to the initialization power source line Vini. This allows the potential of the node N to be decreased toward the initialization potential Vini. Next, when the scanning line Sj connected to one terminal of the boost capacitor Cbs becomes the low level, a potential of the other terminal is pushed down by the boost capacitor Cbs and further, the potential of the node N is pushed down. In this way, the first initialization transistor M4 turning to the on state causes the node N to be connected to the initialization power source line Vini, and thereafter, is further pushed down by the boost capacitor Cbs since the scanning line Sj changes to the low level.

Even when the scanning line Sj changes from the select state to the non-select state (the potential of the scanning line Sj changes from the low level to the high level) when a writing period during which the data voltage is written into the storage capacitor Cst ends, the boost capacitor Cbs is prevented from pushing up the potential of the node N. For this reason, the potential of the node N changes little. This allows an image with a luminance depending on the data signal to be displayed signal after the writing period ends. Note that a structure and actions of the boost capacitor are described in detail later.

The organic EL element OLED includes an anode connected to the second conduction terminal of the driving transistor M1 via the light emission control transistor M6, and a cathode connected to the low level power source line ELVSS. When the light emission control transistor M6 turns to the on state, the drive current supplied from the driving transistor M1 flows through the organic EL element OLED so that the organic EL element OLED emits light with a luminance depending on a current value of the drive current.

1.3 Configuration of Boost Capacitor

Figure 3:
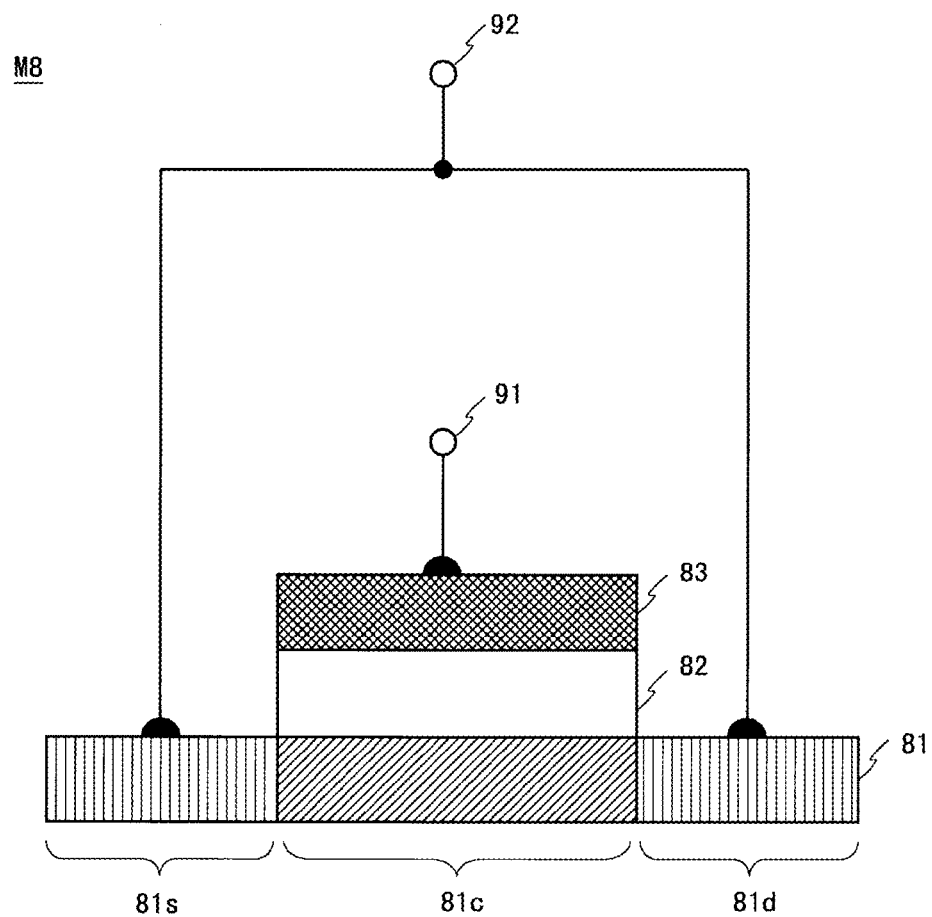
FIG. 3 is a cross-sectional view of a capacitor transistor constituting a MOS capacitor serving as a boost capacitor.

FIG. 3 is a cross-sectional view of the capacitor transistor M8 constituting the MOS capacitor serving as the boost capacitor Cbs. As illustrated in FIG. 3, the capacitor transistor M8 has a structure in which a semiconductor layer 81, a gate insulating film 82, and a gate electrode 83 are layered in this order on an insulating substrate that is not illustrated. The semiconductor layer 81 includes a channel region 81c formed to face the gate electrode 83, a source region 81s with a P-type high-impurity concentration and a drain region 81d, the source region 81s and the drain region 81d being formed to sandwich the channel region 81c therebetween. In the capacitor transistor M8 like this, a MOS capacitor having a structure in which the gate insulating film 82 is sandwiched between the gate electrode 83 and the channel region 81c, is used as the boost capacitor Cbs.

Similar to the transistors M1 to M7 described above, the capacitor transistor M8 is also described as a P-channel type, but in a case that transistors M1 to M7 are N-channel types, the transistor M8 is also an N-channel type. In the present embodiment, a first terminal 91 connected to the gate electrode 83 of the transistor M8 and a second terminal 92 connected to the source region 81s and the drain region 81d are provided so that the capacitor transistor M8 is used as a MOS capacitor 80.

Figure 4:
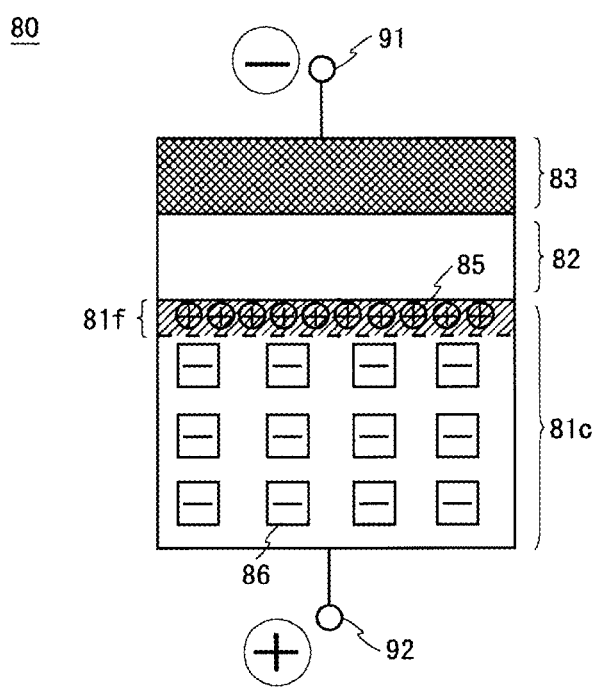
FIG. 4 is a diagram illustrating a MOS capacitor when a low level voltage is applied to a gate electrode connected to a first terminal.

A description is given of a case that a low level voltage is applied to the first terminal 91 in the MOS capacitor 80 like this. FIG. 4 is a diagram illustrating the MOS capacitor 80 when the low level voltage is applied to the gate electrode 83 connected to the first terminal 91. As illustrated in FIG. 4, positive holes are induced on an interface of the channel region 81c, the interface being interposed between the gate insulating film 82 and the channel region 81c, so that an accumulation layer 81f is formed. In this case, a capacitance C1 of the MOS capacitor consists of a capacitance of a capacitor Cox associated with the gate insulating film 82 sandwiched between the gate electrode 83 and the accumulation layer 81f of the channel region 81c.

Figure 5:
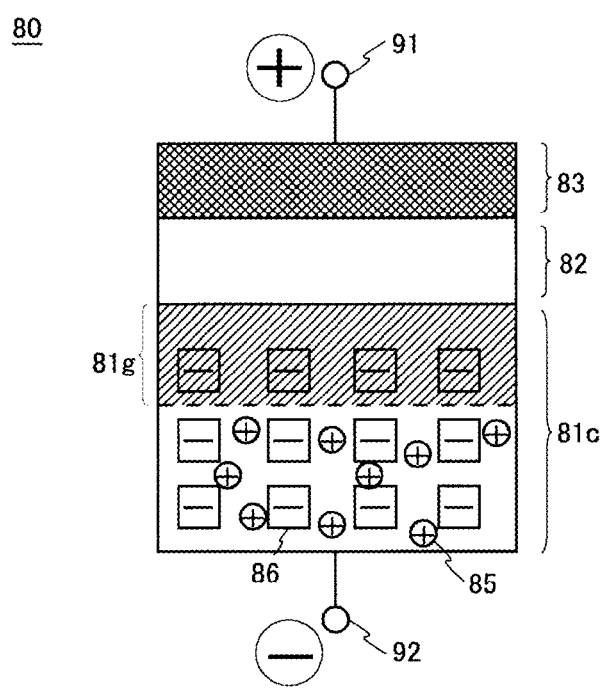
FIG. 5 is a diagram illustrating the MOS capacitor when a high level voltage is applied to the gate electrode connected to the first terminal.

Next, a description is given of a case that a high level voltage is applied to the first terminal 91 of the MOS capacitor 80. FIG. 5 is a diagram illustrating the MOS capacitor 80 when the high level voltage is applied to the gate electrode 83 connected to the first terminal 91. As illustrated in FIG. 5, in a case where the high level voltage is applied to the first terminal 91, a depletion layer 81g is formed on an interface of the channel region 81c, the interface being interposed between the channel region 81c and the gate insulating film 82. In this case, a capacitance C2 of the MOS capacitor is a capacitance C2 obtained by connecting in series the capacitance C1 of the capacitor Cox associated with the gate insulating film 82 and a capacitance of a capacitor Cdep associated with the depletion layer 81g, and is expressed by an equation below.

$$1/C2=1/Cox+1/Cdep=1/C1+1/Cdep \qquad (1)$$

According to Equation (1) above, it can be found that the capacitance C2 is smaller as compared with the capacitance C1.

A description is given of a case that the first terminal 91 is connected to the scanning line Sj and the second terminal 92 is connected to the node N in order to use the MOS capacitor 80 like this as the boost capacitor Cbs. First, as illustrated in FIG. 4, when the potential of the scanning line Sj changes from the high level to the low level, the potential of the gate electrode 83 becomes the low level. This allows the positive holes that are majority carriers of the channel region 81c to be induced on an interface of the channel region 81c, the interface being interposed between the channel region 81c and the gate electrode 83, so that a capacitance of the boost capacitor Cbs is C1. This allows the potential of the node N to be largely pushed down by the boost capacitor Cbs so that the data voltage supplied from the data line Di is supplied to the node N for a short time. As a result, the storage capacitor Cst is charged for a short time, allowing the data voltage to be held.

As illustrated in FIG. 5, when the potential of the scanning line Sj changes from the low level to the high level, the depletion layer 81g is formed on an interface of the channel region 81c, the interface being interposed between the channel region 81c and the gate insulating film, so that a capacitance of the boost capacitor Cbs is C2 smaller than C1. For this reason, even when the potential of the scanning line Sj changes to the high level, pushing up of the potential of the node N caused by this change is considerably suppressed. As a result, the data voltage held in the storage capacitor Cst changes little.

In this way, the use of the MOS capacitor 80 as the boost capacitor Cbs enables that in a case that the storage capacitor Cst is charged via the low transconductance driving transistor M1, the potential of the node N that is the gate voltage of the driving transistor M1, is led to a low potential where a current drive capability is higher when the writing period starts. This allows the potential of the node N to be decreased to the data voltage for a short time. The potential of the scanning line Sj is made to change from the low level to the high level when the writing period ends. This allows the pushing up of the node N by the boost capacitor Cbs to be suppressed to the minimum. As a result, the organic EL element OLED can be made to emit light with a luminance depending on the data signal.

In a case that the capacitance of the storage capacitor Cst used for the pixel circuit 11 is tens to hundreds of pFs, it is preferable to use, for the boost capacitor Cbs, the MOS capacitor in which a capacitance value of the storage capacitor Cst is a capacitance in a range from 5% to 50%. Here, the reason why the capacitance value of the boost capacitor Cbs is 5% or more is because in a case where the capacitance value is less than 5%, a range of a voltage value of the gate voltage Vg of the driving transistor M1 required for controlling the drive current cannot be sufficiently ensured. The reason why the capacitance value is 50% or less is because in a case where the capacitance value is greater than 50%, an insufficient load capacity of the pixel circuit 11 to be charged with the data voltage decreases a charging speed, or a charging rate for the pixel circuit 11 cannot be sufficiently ensured in a case that a driving frequency is constant.

1.4 Arrangement Diagram of Pattern Forming Boost Capacitor

Figure 6:
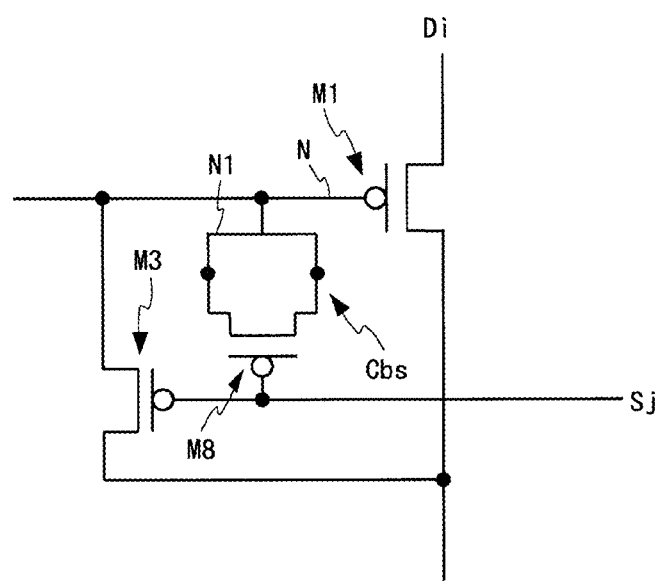
FIG. 6 is a circuit diagram including a capacitor transistor constituting a boost capacitor, a compensation transistor, a scanning line, and a node in the pixel circuit illustrated FIG. 2.

FIG. 6 is a circuit diagram including the capacitor transistor M8 constituting the boost capacitor Cbs, the compensation transistor M3, the scanning line Sj, and the node N in the pixel circuit 11 illustrated FIG. 2. As illustrated in FIG. 6, respective wiring lines connected to a drain terminal and the source terminal of the compensation transistor M3, and the node N are formed of a polysilicon wiring line (also referred to as a "semiconductor wiring line"). The gate electrodes of the compensation transistor M3 and the capacitor transistor M8, and the scanning line Sj is formed of a metal wiring line. One end of the polysilicon wiring line is connected to the gate terminal of the driving transistor M1, and the other end is connected to the drain terminal of the driving transistor M1.

Figure 7:
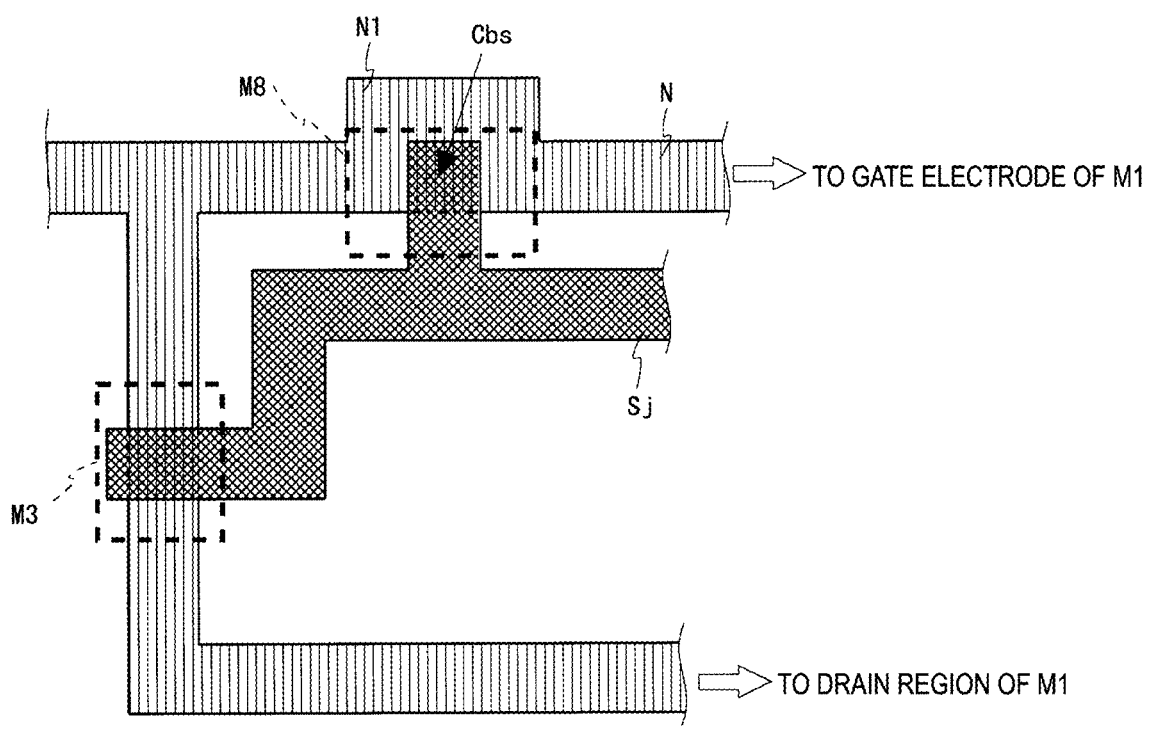
FIG. 7 is a diagram illustrating an example of a configuration of a boost capacitor including a MOS capacitor.

FIG. 7 is a diagram illustrating an example of a configuration of the boost capacitor Cbs including the MOS capacitor. As illustrated in FIG. 7, the gate electrode of the capacitor transistor M8 constituting boost capacitor Cbs branches from the scanning line Sj and extends to cover the node N. The source region and the drain region are formed in the node N. The source region and the drain region are shorted by the auxiliary wiring line (also referred to as the "second wiring line") N1 which is formed in parallel with the node N and made of polysilicon, and thus the potentials of the node N on both sides of the gate electrode are the same potential, regardless of the potential of the gate electrode. In this way, one end of the boost capacitor Cbs includes the metal wiring line which branches and extends from the scanning line Sj, and the other end includes the source region and the drain region formed in the polysilicon wiring line constituting the node N, and the auxiliary wiring line N1 connecting the source region and the drain region.

The configuration of the node N and the capacitor transistor M8 is described in further detail. The node N includes the metal wiring line, and includes a gate wiring line extending from the gate electrode of the driving transistor M1 and the polysilicon wiring line electrically connected to the gate wiring line. The polysilicon wiring line is provided as the auxiliary wiring line N1 shorting the source region and the drain region of the capacitor transistor M8, and the node N extending toward the compensation transistor M3. The polysilicon wiring line is electrically connected to the gate wiring line via a conduction terminal on the gate electrode side among the conduction terminals of the capacitor transistor M8.

1.5 Driving Method

Figure 8:
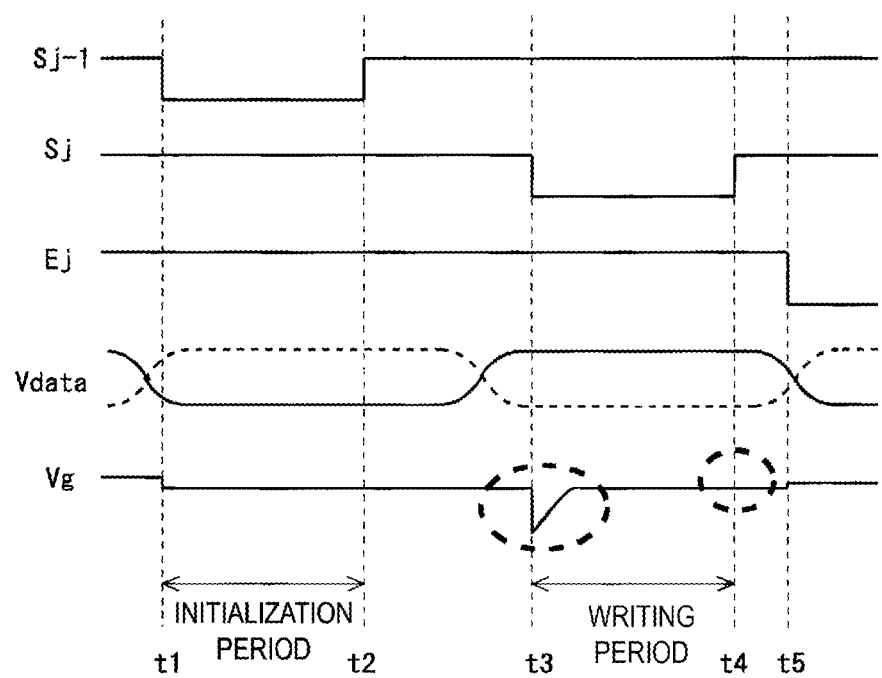
FIG. 8 is a timing chart for describing a driving method of the pixel circuit illustrated in FIG. 2.

A description is given of a driving method of the organic EL display device 1 according to the embodiment with reference to FIGS. 2 and 8. FIG. 8 is a timing chart for describing a driving method of the pixel circuit 11 illustrated in FIG. 2.

As illustrated in FIG. 8, at a time point t1, a voltage of the immediately preceding scanning line Sj−1 changes from the high level to the low level (active). This allows the first initialization transistor M4 to turn to the on state to start an initialization period during which the potential of the node N is the initialization potential Vini. After that, at a time point t2, the potential of the immediately preceding scanning line Sj−1 changes from the low level to the high level so that the initialization period ends. This allows the potential of the node N to be the initialization potential Vini.

At the time t3, the voltage of the scanning signal Sj changes from the high level to the low level. Accordingly, the writing transistor M2 and the compensation transistor M3 turn to the on state. This allows the data voltage Vdata held in the data line capacitor Cdi of the data line Di to be supplied to the node N connected to the gate terminal of the driving transistor M1 via the writing transistor M2, the driving transistor M1, and the compensation transistor M3 in this order, and written into the storage capacitor Cst. At this time, the potential of the node N is the initialization potential Vini, and thus, in a case where the low level voltage is applied to the scanning line Sj connected to the first terminal 91 of the boost capacitor Cbs, the potential of the node N connected to the second terminal 92 is pushed down by the boost capacitor Cbs. This pushes down the gate voltage Vg of the driving transistor M1 for a short time, and therefore, even when the transconductance of the driving transistor is low, the data voltage Vdata is written into the storage capacitor Cst for a short time. Supplying the data voltage Vdata to the node N of the pixel circuit 11 continues in a period during which the voltage the scanning line Sj is the low level, that is, in the writing period from t3 to t4 during which the scanning line Sj is in the select state so that a voltage of the data voltage Vdata overlapped with the threshold voltage of the driving transistor M1 is written into the storage capacitor Cst.

Note that in the period from the time point t3 to the time point t4, a voltage of the light emission control line Ej is the high level, and thus the power supply transistor M5 and the light emission control transistor M6 are in the off state. Therefore, the drive current is not supplied from the driving transistor M1 to the organic EL element OLED so that the organic EL element OLED is in a non-emitting state.

At the time point t1, the voltage of the immediately preceding scanning line Sj−1 changes from the high level to the low level so that the second initialization transistor M7 also turns to the on state. As a result, an anode voltage of the organic EL element OLED is initialized. This initialization action by the second initialization transistor M7 is not directly involved with the disclosure, and therefore, a description thereof is omitted below.

At the time point t4, the potential of the scanning line Sj changes from the low level to the high level so that the writing period ends. Accordingly, the writing transistor M2 and the compensation transistor M3 turn to the off state. At this time, the MOS capacitor constituting the boost capacitor Cbs is a combined capacitance of the capacitance C1 of the capacitor Cox associated with the gate insulating film and the capacitance C2 of the capacitor Cdep associated with the depletion layer, and therefore, pushing up of the potential of the node N caused by the change in the potential of the scanning line Sj is suppressed.

At a time point t5, the voltage of the light emission control line Ej changes from the high level to the low level so that the power supply transistor M5 and the light emission control transistor M6 change to the on state. With this action, the drive current determined depending on the gate voltage Vg of the driving transistor M1, that is, the drive current depending on the data voltage Vdata held in the storage capacitor Cst is supplied to the organic EL element OLED. As a result, the organic EL element OLED emits light with a luminance depending on a current value of the drive current. An image of one frame is displayed by repeating the actions as described above n times.

1.6 Modification Example of Boost Capacitor

The example of the arrangement of the pattern forming the boost capacitor Cbs is described above with reference to FIG. 7, and a modification example thereof is described below. Note that the configurations of the polysilicon wiring line and metal wiring line other than the boost capacitor Cbs are the same as the configurations illustrated in FIG. 7, and therefore, a description of the configurations is omitted and the configuration of the boost capacitor Cbs is described below.

1.6.1 First Modification Example

Figure 9:
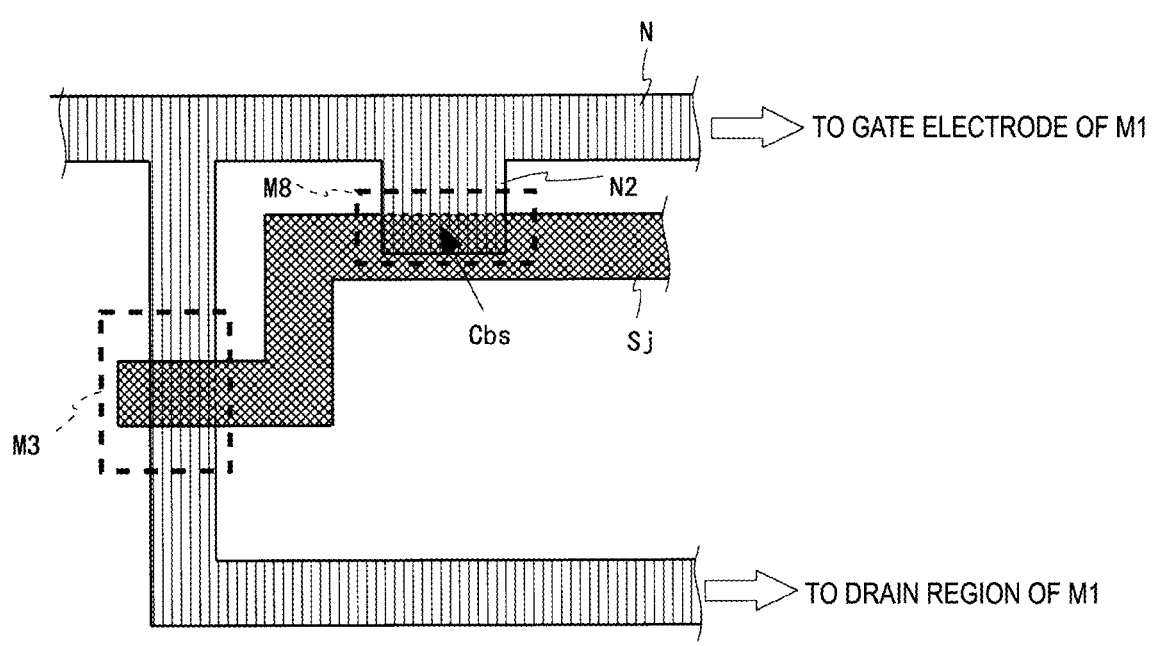
FIG. 9 is a diagram illustrating a first modification example of the configuration of the boost capacitor including the MOS capacitor.

FIG. 9 is a diagram illustrating a first modification example of the configuration of the boost capacitor Cbs including the MOS capacitor. As illustrated in FIG. 9, the boost capacitor Cbs in this modification example includes a projection N2 protruding from a lateral side of the node N toward the scanning line Sj side and the scanning line Sj formed to overlap the projection N2. The projection N2 extends only to an underside of the metal wiring line, and does not penetrate to an opposite side of the metal wiring line. In this case, a potential of the projection N2 is the same as the potential of the node N, and therefore, an effect the same as the boost capacitor Cbs illustrated in FIG. 7 is provided as the potential of the scanning line Sj changes.

1.6.2 Second Modified Example

Figure 10:
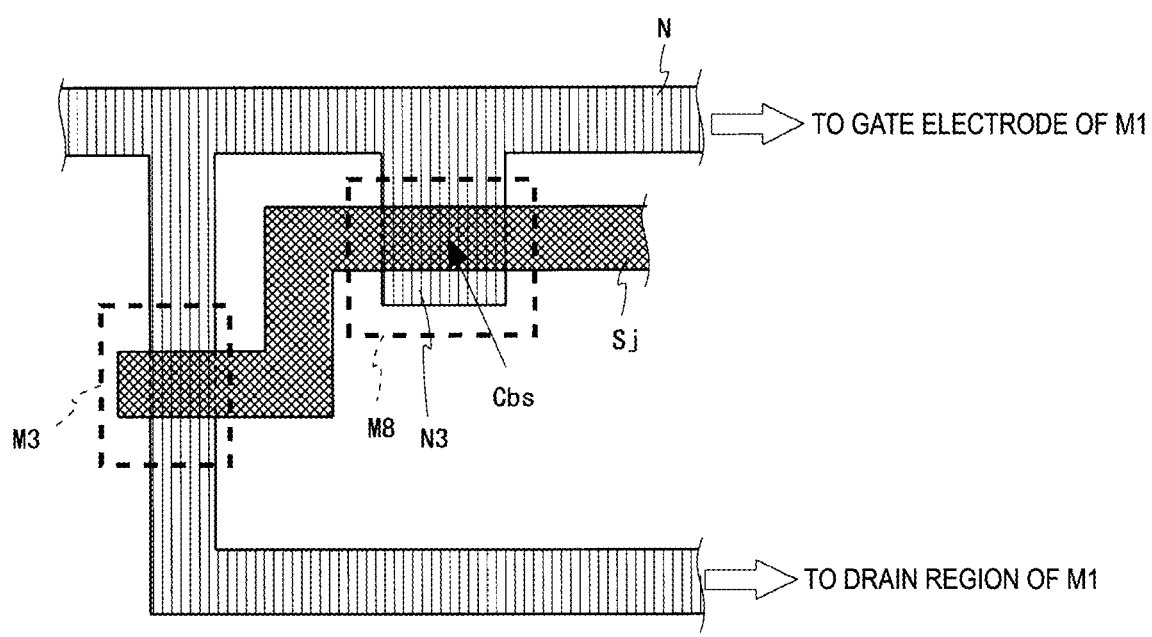
FIG. 10 is a diagram illustrating a second modification example of the configuration of the boost capacitor including the MOS capacitor.

FIG. 10 is a diagram illustrating a second modification example of the configuration of the boost capacitor Cbs including the MOS capacitor. As illustrated in FIG. 10, the configuration of the boost capacitor Cbs in this modification example resembles the configuration of the boost capacitor Cbs in the first modification example. However, a projection N3 protruding from the lateral side of the node N toward the scanning line Sj passes through the underside of the scanning line Sj and penetrates to the opposite side. In this case, a portion of the projection N3 penetrating through the scanning line Sj is in a floating state depending on a potential applied to the scanning line Sj. However, an area where the projection N3 overlaps the scanning line Sj constitutes the boost capacitor Cbs, and thus the function of the boost capacitor Cbs is not affected even when a portion of the projection N3 is in the floating state. The boost capacitor Cbs in this modification example provides an effect the same as the case illustrated in FIG. 7 as the potential of the scanning line Sj changes. Furthermore, the projection N3 is formed to penetrate through the scanning line Sj, and thus even when an alignment deviation is generated in forming the scanning line Sj after forming the projection N3, an area where the projection N3 overlaps the scanning line Sj does not change. Therefore, the potential of the node N that is pushed down or pushed up by the boost capacitor Cbs is constant regardless of a deviation amount of the alignment deviation.

1.6.3 Third Modification Example

Figure 11:
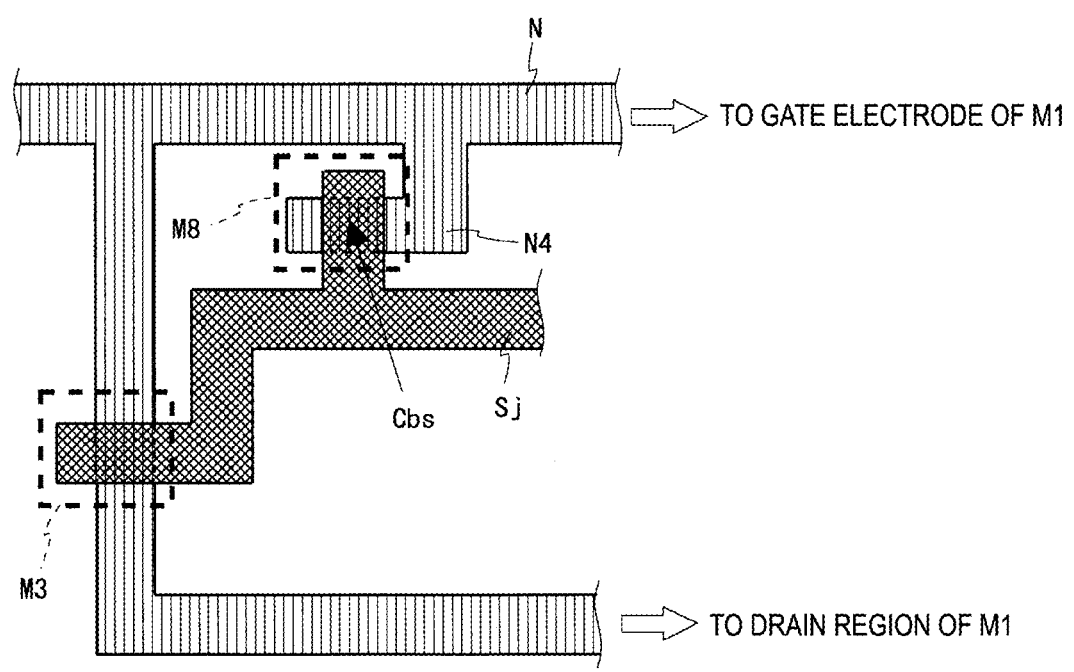
FIG. 11 is a diagram illustrating a third modification example of the configuration of the boost capacitor including the MOS capacitor.

FIG. 11 is a diagram illustrating a third modification example of the configuration of the boost capacitor Cbs including the MOS capacitor. As illustrated in FIG. 11, the boost capacitor Cbs in this modification example includes a hook-type projection N4 branching from the lateral side of the node N toward the scanning line Sj side, and a gate electrode branching from the scanning line Sj toward the hook-type projection N4 and formed to penetrate through the hook-type projection N4. In this case, a portion of the hook-type projection N4 penetrating through the scanning line Sj is in the floating state depending on a potential of the scanning line Sj. However, an area where the hook-type projection N4 overlaps the scanning line Sj constitutes the boost capacitor Cbs, and thus the function of the boost capacitor Cbs is not affected even when a portion of the hook-type projection N4 is in the floating state. The boost capacitor Cbs in this modification example provides an effect that is the same as the case illustrated in FIG. 7 as the potential of the scanning line Sj changes. Furthermore, the hook-type projection N4 is formed to penetrate through the scanning line Sj, and thus even when an alignment deviation is generated in forming the scanning line Sj after forming the hook-type projection N4, an area where the hook-type projection N4 overlaps the scanning line Sj does not change. Therefore, the potential of the node N that is pushed down or pushed up by the boost capacitor Cbs is constant regardless of the deviation amount of the alignment deviation.

1.6.4 Fourth Modification Example

Figure 12:
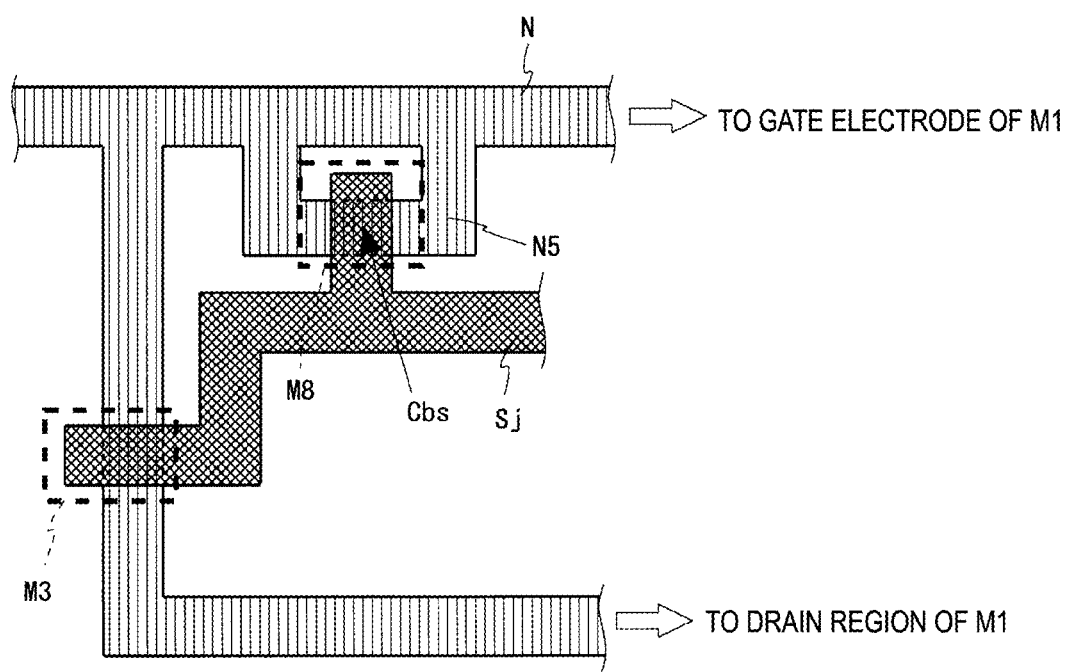
FIG. 12 is a diagram illustrating a fourth modification example of the configuration of the boost capacitor including the MOS capacitor.
Figure 13:
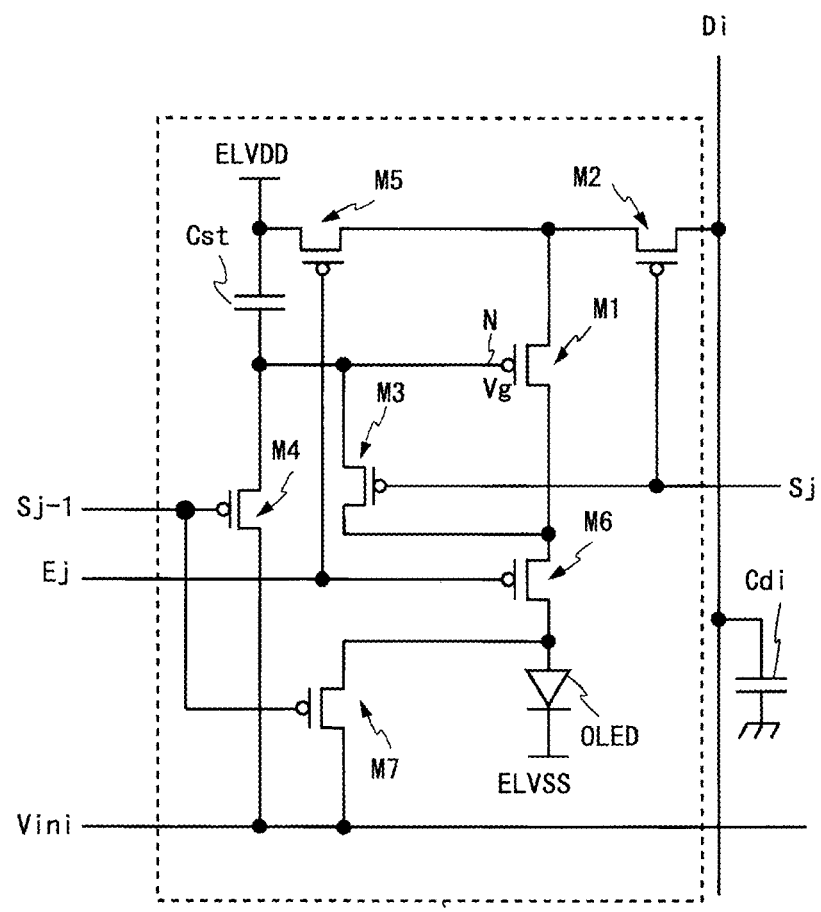
FIG. 13 is a diagram illustrating a configuration of a pixel circuit in the related art.
Figure 14:
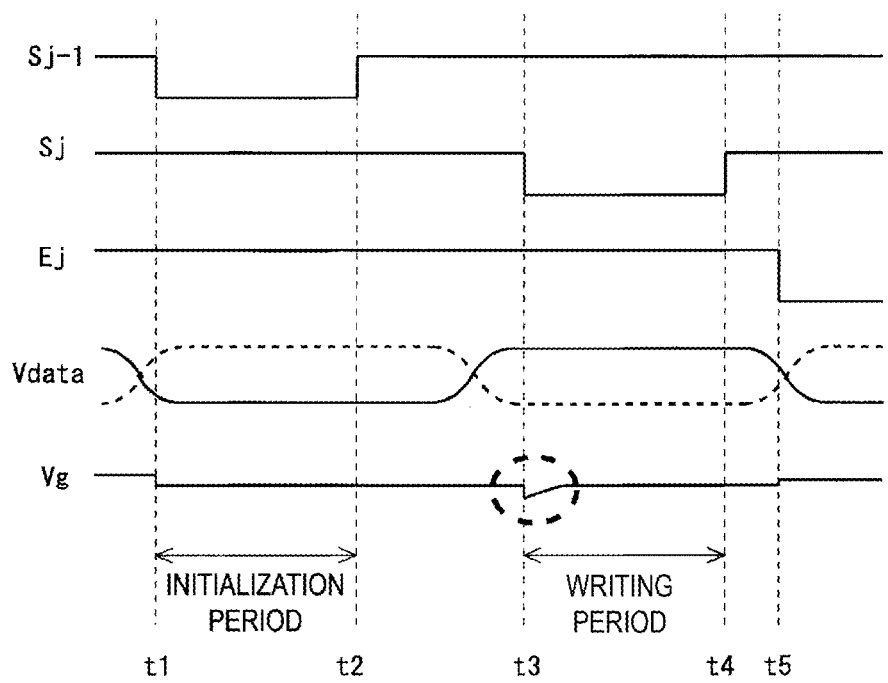
FIG. 14 is a timing chart illustrating pixel circuit actions of the pixel circuit illustrated in FIG. 13.
Figure 15:
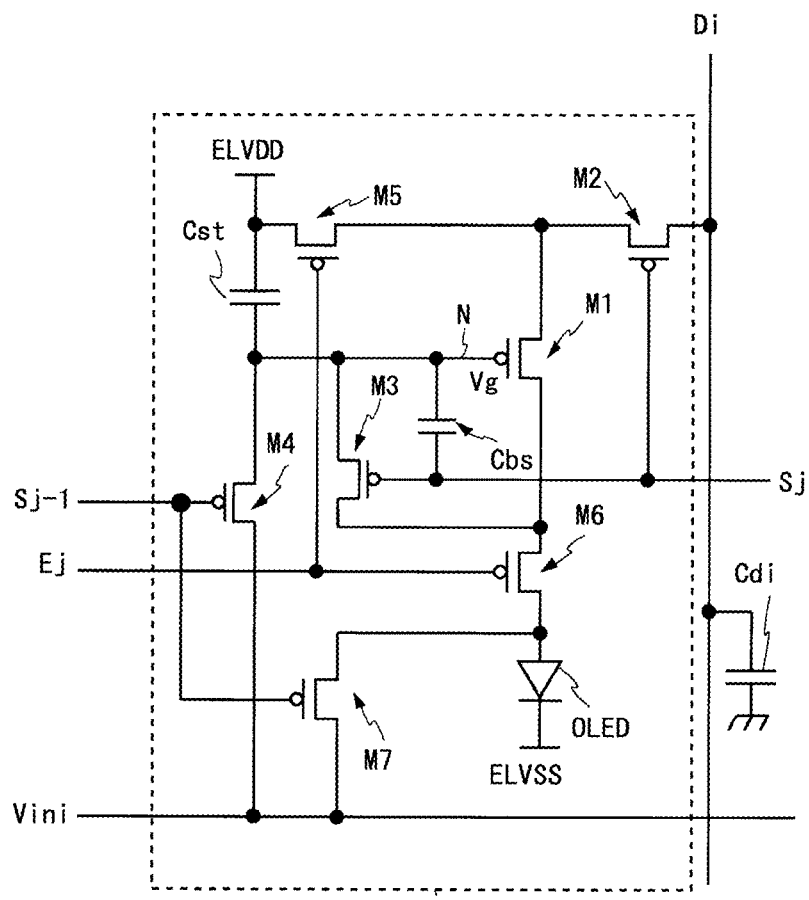
FIG. 15 is a diagram illustrating a configuration of a pixel circuit in the related art described in PLT 1.
Figure 16:
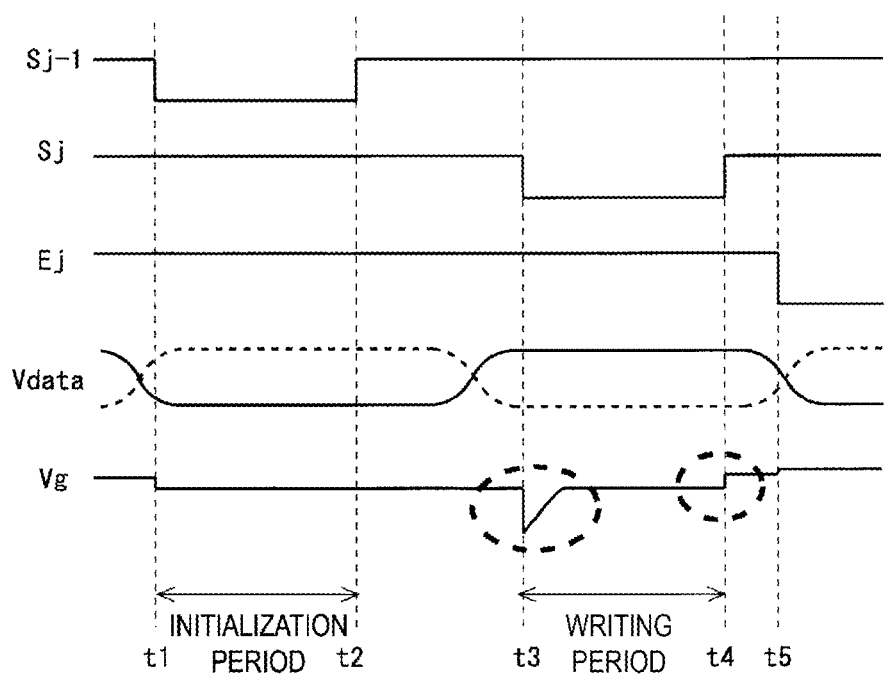
FIG. 16 is a timing chart illustrating actions of the pixel circuit illustrated in FIG. 15.

FIG. 12 is a diagram illustrating a fourth modification example of the configuration of the boost capacitor Cbs including the MOS capacitor. As illustrated in FIG. 12, the boost capacitor Cbs in this modification example includes an auxiliary wiring line (also referred to as a "third wiring line") N5 formed such that both ends of the auxiliary wiring line are connected to different positions in the node N and a gap is formed between the auxiliary wiring line and the node N, and an gate electrode branching from the scanning line Sj toward the auxiliary wiring line N5 side and penetrating through the auxiliary wiring line N5 to extend to an area surrounded by the auxiliary wiring line N5 and the node N. In this case, a portion of the auxiliary wiring line N5 penetrating through the scanning line Sj is in the floating state depending on a potential of the scanning line Sj. However, both ends of the auxiliary wiring line N5 are connected to the node N, and therefore, a portion of the auxiliary wiring line N5 does not turn to the floating state. For this reason, the area where the auxiliary wiring line N5 overlaps the gate electrode branching from scanning line Sj serves as the boost capacitor Cbs. Note that an effect of this modification example is the same as the third modification example, and the description thereof is omitted.

1.7 Effects

According to the organic EL display device 1 of the present embodiment, in a case where the storage capacitor Cst is charged via the low transconductance driving transistor M1, the potential of the node N that is the gate voltage of the driving transistor M1 can be led to a low potential where the current drive capability is higher when the writing period starts, and therefore, the potential of the node N can be decreased to the data voltage for a short time. The potential of the scanning line Sj is made to change from the low level to the high level when the writing period ends, and thus the pushing up of the node N by the boost capacitor Cbs can be suppressed to the minimum. This allows the organic EL element OLED to emit light with a luminance depending on the data signal.

It is preferable to use the MOS capacitor in which the capacitance value is from 5% to 50% of a capacitance value of the storage capacitor Cst. Here, the reason why the capacitance value of the boost capacitor Cbs is 5% or more is because in a case where the capacitance value is less than 5%, a range of a voltage value of the gate voltage Vg of the driving transistor M1 required for controlling the drive current cannot be sufficiently ensured. The reason why the capacitance value is 50% or less is because in a case where the capacitance value is greater than 50%, an insufficient load capacity of the pixel circuit 11 to be charged with the data voltage decreases a charging speed, or a charging rate for the pixel circuit 11 cannot be sufficiently ensured in a case that a driving frequency is constant.

The MOS capacitance constituting the boost capacitor Cbs uses the capacitor transistor M8 which is formed in the projections N2 to N4 protruding from the lateral side of the node N, or formed using the auxiliary wiring line N1 or N5 formed to be in parallel with the node N. In this case, in a case where the gate electrode of the capacitor transistor M8 is formed to penetrate through the projection N3 or N4, or the auxiliary wiring line N5, even when the alignment deviation is generated in forming the projection or the auxiliary wiring line, the capacitance of the boost capacitor Cbs does not change due to the alignment deviation. Therefore, the potential of the node N that is pushed down or pushed up by the boost capacitor Cbs is constant regardless of the deviation amount of the alignment deviation.

REFERENCE SIGNS LIST

1 Organic EL display device (display device)
10 Display portion
11 Pixel circuit
20 Display control circuit
30 Data line drive circuit
50 Scanning line drive circuit
60 Light emission control line drive circuit
Di Data line
Sj Scanning line (j=1 to n)
Ej Light emission control line (j=1 to n)
Cdi Data line capacitor (i=1 to m)
M1 Driving transistor
M2 Writing transistor
M3 Compensation transistor
M4 First initialization transistor
M5 Power supply transistor
M6 Light emission control transistor
M7 Second initialization transistor
M8 Capacitor transistor
N Node (first wiring line)
N1 Auxiliary wiring line (second wiring line)
N2, N3 Projection
N4 Hook-type projection
N5 Auxiliary wiring line (third wiring line)
Cst Storage capacitor (first capacitance)
Cbs Boost capacitor (second capacitance)
OLED Organic EL element (display element)

The invention claimed is:

1. A display device including a plurality of data lines that transmit a plurality of data signals indicating an image to be displayed, a plurality of scanning lines intersecting the plurality of data lines, and a plurality of pixel circuits arranged in a matrix along the plurality of data lines and the plurality of scanning lines, the display device comprising:
  a data line drive circuit that outputs the plurality of data signals to the plurality of data lines; and
  a scanning line drive circuit that supplies a scanning signal to the plurality of scanning lines to selectively drive the plurality of scanning lines, wherein
  each of the plurality of pixel circuits corresponds to any one of the plurality of data lines and corresponds to any one of the plurality of scanning lines,
  each of the plurality of pixel circuits includes a display element driven by a current, a first capacitor that holds a voltage controlling the drive current for the display element, a driving transistor that supplies a drive current depending on the voltage held in the first capacitor to the display element, a second capacitor connecting a corresponding one of the plurality of scanning lines to a control terminal of the driving transistor,
  the second capacitor includes a MOS capacitor and controls a voltage applied to the control terminal of the driving transistor by use of a capacitance changing depending on a level of the scanning signal supplied to the corresponding one of the plurality of scanning lines,
  the second capacitor includes a MOS transistor including a semiconductor layer including a gate terminal, a gate insulating film, a first conduction terminal, and a second conduction terminal, the gate terminal includes a metal wiring line branching from the corresponding one of the plurality of scanning lines, the semiconductor layer includes a first wiring line connecting the control terminal of the driving transistor to an end of the first capacitor, or a semiconductor wiring line branching from the first wiring line, and the first conduction terminal and the second conduction terminal are shorted, the first wiring line includes a projection protruding from a lateral side of the first wiring line, at least one of the first conduction terminal and the second conduction terminal is located in the projection, and the gate terminal is overlapping at least a portion of the projection, and a portion of the one of the corresponding scanning lines extends along the first wiring line and the projection extends only to an underside of the portion of the one of the corresponding scanning lines.

2. The display device according to claim 1, wherein the second capacitor is a MOS capacitor including an electrode, an insulating layer, and a semiconductor layer, and the electrode is connected to the scanning line, and the semiconductor layer is connected to the control terminal of the driving transistor.

3. The display device according to claim 2, wherein when a voltage is applied to the electrode, the voltage having such a level that an accumulation layer is formed in an interface of the semiconductor layer in contact with the insulating layer, the second capacitor controls to pull a voltage to be applied the control terminal of the driving transistor.

4. The display device according to claim 2, wherein when a voltage is applied to the electrode, the voltage having such a level that a depletion layer is formed in an interface of the semiconductor layer in contact with the insulating layer, the second capacitor controls to suppress pulling a voltage to be applied the control terminal of the driving transistor.

5. The display device according to claim 3, further comprising:

a writing transistor that causes the corresponding one of the plurality of scanning lines to be in a select state to supply the data signal from the data line to the driving transistor, wherein a capacitance of the second capacitor when the writing transistor is in an on state is larger than a capacitance of the second capacitor in an off state.

6. The display device according to claim 2, wherein a capacitance value of the second capacitor is from 5% to 50% of a capacitance value of the first capacitor.

7. The display device according to claim 1, wherein the gate terminal is a line that intersects the projection, the first conduction terminal and the second conduction terminal are provided in the projection with the line being interposed between the first conduction terminal and the second conduction terminal, and one conduction terminal of the first conduction terminal and the second conduction terminal located at a position farther from the first wiring line is electrically in a floating state.

8. The display device according to claim 1, wherein the projection is a hook-type projection, the gate terminal branching from the scanning line intersects the hook-type projection, the first conduction terminal and the second conduction terminal are arranged in the hook-type projection with the gate terminal being interposed between the first conduction terminal and the second conduction terminal, and one conduction terminal of the first conduction terminal and the second conduction terminal located at a position farther from the first wiring line is electrically in a floating state.

9. The display device according to claim 1, wherein the projection is a third wiring line, a gap being located between the third wiring line and the first wiring line, both ends of the third wiring line being connected to different positions in the first wiring line, the gate terminal branches from the scanning line, intersects the third wiring line, and extends to an area between the first wiring line and a second wiring line in parallel with the first wiring line, and the first conduction terminal and the second conduction terminal are located-in the third wiring line with the gate terminal being interposed between the first wiring line and a second wiring line.

10. The display device according to claim 1, wherein a potential of the projection is equal to a potential of the first wiring line.

* * * * *